(12) United States Patent
Ahn et al.

(10) Patent No.: US 11,940,726 B2
(45) Date of Patent: Mar. 26, 2024

(54) MASK PROTECTIVE MODULE, PELLICLE HAVING THE SAME, AND LITHOGRAPHY APPARATUS HAVING THE SAME

(71) Applicant: INDUSTRY-UNIVERSITY COOPERATION FOUNDATION HANYANG UNIVERSITY, Seoul (KR)

(72) Inventors: Jinho Ahn, Seoul (KR); Jung Hwan Kim, Seoul (KR); Seongchul Hong, Seoul (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 3 days.

(21) Appl. No.: 17/851,580

(22) Filed: Jun. 28, 2022

(65) Prior Publication Data

US 2022/0334467 A1 Oct. 20, 2022

Related U.S. Application Data

(60) Division of application No. 16/298,991, filed on Mar. 11, 2019, now Pat. No. 11,402,746, which is a continuation of application No. PCT/KR2016/010478, filed on Sep. 20, 2016.

(30) Foreign Application Priority Data

Sep. 12, 2016 (KR) .................. 10-2016-0117214

(51) Int. Cl.
*G03F 1/66* (2012.01)
*G03F 1/00* (2012.01)
*G03F 1/62* (2012.01)
*G03F 7/00* (2006.01)
(Continued)

(52) U.S. Cl.
CPC .................. *G03F 1/66* (2013.01); *G03F 1/00* (2013.01); *G03F 1/62* (2013.01); *G03F 7/20* (2013.01); *G03F 7/70008* (2013.01); *G03F 7/70983* (2013.01); *H01L 21/027* (2013.01)

(58) Field of Classification Search
CPC ..... G03F 1/66; G03F 1/64; G03F 1/62; G03F 7/70983
See application file for complete search history.

(56) References Cited

U.S. PATENT DOCUMENTS

| 2016/0070180 | A1 | 3/2016 | Hwang et al. |
| 2018/0364561 | A1 | 12/2018 | Vles et al. |
| 2020/0057394 | A1* | 2/2020 | Kruizinga ........... G03F 7/70825 |

FOREIGN PATENT DOCUMENTS

| JP | H02195355 A | 8/1990 |
| JP | 2016114820 A | 6/2016 |
| KR | 20010005120 A | 1/2001 |

(Continued)

*Primary Examiner* — Daborah Chacko-Davis

(57) ABSTRACT

A lithography apparatus comprises a light source for emitting light; a mask mounting zone where a mask for reflecting the light is disposed; and a mask protective module disposed on the mask to transmit the light from the light source toward the mask. The mask protective module comprises a frame and a membrane supported by the frame, wherein the membrane includes a penetration region for transmitting the light and a peripheral region of which a light transmittance is lower than that of the penetration region.

4 Claims, 13 Drawing Sheets

(51) Int. Cl.
*G03F 7/20* (2006.01)
*H01L 21/027* (2006.01)

(56) References Cited

FOREIGN PATENT DOCUMENTS

| | | |
|---|---|---|
| KR | 20040005355 A | 1/2004 |
| KR | 20070014308 A | 2/2007 |
| KR | 20070070636 A | 7/2007 |
| KR | 20150070727 A | 6/2015 |
| KR | 20150145256 A | 12/2015 |
| KR | 20160028899 A | 3/2016 |

* cited by examiner

MASK PROTECTIVE MODULE, PELLICLE HAVING THE SAME, AND LITHOGRAPHY APPARATUS HAVING THE SAME

CROSS-REFERENCE TO RELATED APPLICATION

This application is a division of U.S. application Ser. No. 16/298,991 filed Mar. 11, 2019, which is a continuation of pending International Application No. PCT/KR2016/010478, which was filed on Sep. 20, 2016 and claims priority to Korean Patent Application No. 10-2016-0117214, filed on Sep. 12, 2016, in the Korean Intellectual Property Office, the disclosures of which are hereby incorporated by reference in their entireties.

BACKGROUND

1. Field

The present disclosure herein relates to a mask protective module, a pellicle having the same, and a lithography apparatus having the same.

2. Description of the Related Art

As critical dimensions of circuits in semiconductor devices shrink spectacularly, there is limits to form fine patterns by ArF immersion lithography apparatuses using light source of 193 nm wavelength. Double exposure or quadruple exposure techniques have been applied to form fine patterns without improvement of light sources and lithography apparatuses. However, these techniques may cause an increase in process steps, an increase in process costs, and a throughput reduction in the manufacturing of semiconductor devices of which mass production is critical.

To solve the above problems, an extreme ultraviolet (EUV) light lithography technique which uses extreme ultraviolet light of 13.5 nm wavelength as a light source has been adapted to a next generation lithography apparatus. Since the light of 12.5 nm wavelength used in the extreme ultraviolet light lithography technique is absorbed into almost all materials, reflective reticles like as mirrors take the place of conventional transmissive reticles. If dust or foreign material covers on this reticle, light may be absorbed or reflected by the dust or foreign material such that transcribed patterns are damaged to induce performance or throughput deterioration of semiconductor devices or liquid crystal displays. To prevent contaminations on the surface of the reticle, it is implemented to adhere a mask protective module such as a pellicle to the surface of the reticle. Thus, it has been widely performed to develop a pellicle with thin thickness and high transmittance characteristics for the extreme ultraviolet light.

For example, Korean Patent Registration No. KR1552940B1 (Application No. KR20130157257A, Applicant: Samsung Electronics Co., LTD) discloses a method of manufacturing a graphite containing thin film used as an EUV pellicle, which has strong tensile stress as well as high EUV transmittance.

SUMMARY

Embodiments of the present disclosure may provide a mask protective module effective for manufacturing in large area, a pellicle having the same, and a lithography apparatus having the same.

Embodiments of the present disclosure may also provide a mask protective module with enhanced strength, a pellicle having the same, and a lithography apparatus having the same.

Embodiments of the present disclosure may further provide a mask protective module with enhanced EUV transmittance, a pellicle having the same, and a lithography apparatus having the same.

Embodiments of the present disclosure may further provide a mask protective module with enhanced thermal property, a pellicle having the same, and a lithography apparatus having the same.

Embodiments of the present disclosure may further provide a mask protective module with long life, a pellicle having the same, and a lithography apparatus having the same.

Embodiments of the present disclosure may further provide a mask protective module with reduced manufacturing cost, a pellicle having the same, and a lithography apparatus having the same.

Embodiments of the present disclosure are not limited to the above.

In an aspect, a mask protective module may include a frame and a membrane supported by the frame. The membrane may include regions of which light transmittances, heat conductivities and/or strengths are different from each other.

In an embodiment, the membrane may have a penetration region where light is transmitted, and a peripheral region of which the light transmittance is lower than that of the penetration region. The peripheral region may surround the penetration region.

In an embodiment, the heat conductivity of the peripheral region may be higher than that of the penetration region.

In an embodiment, the peripheral region and the penetration region may have different thicknesses from each other.

In an embodiment, the peripheral region may be thicker than the penetration region.

In an embodiment, the peripheral region and the penetration region may be formed of the same material, and the peripheral region may be thicker than the penetration region.

In an embodiment, the peripheral region and the penetration region may be formed of different materials from each other.

In an embodiment, the strength of the peripheral region may be higher than that of the penetration region.

In an embodiment, a ratio of an area of the peripheral region to an entire area of the membrane may be greater than a ratio of an area of the penetration region to the entire area of the membrane.

In an embodiment, the penetration region may include a first penetration region where light entering the membrane from an outside is transmitted, and a second penetration region transmitting light which is transmitted through the first penetration region and then is reflected from a mask disposed on the membrane. The first penetration region and the second penetration region may be spaced apart from each other.

In an embodiment, the peripheral region may include a first peripheral region surrounding the penetration region, and a second peripheral region surrounding the first peripheral region. The heat conductivity of the first peripheral region may be higher than that of the second peripheral region, and the strength of the second peripheral region may be higher than that of the first peripheral region.

In an embodiment, the membrane may have a plane shape.

In an embodiment, the frame and the membrane may surround an interior space, and at least a portion of the frame may be configured to open the interior space such that a path for inserting or withdrawing a mask into/from an interior space is provided.

In an embodiment, the frame and the membrane may surround an interior space, the frame may include a first frame and a second frame which are separable from each other, and the membrane may include a first membrane and a second membrane which are separable from each other. The first membrane may be supported by the first frame, and the second membrane may be supported by the second frame. A first segment including the first membrane and the first frame may be separable from the second segment including the second membrane and the second frame to provide a path for inserting or withdrawing a mask into/from an interior space.

In an aspect, a pellicle may include the mask protective module described above.

In an aspect, a lithography apparatus may include a light source for emitting light, a mask mounting zone where a mask for reflecting the light is disposed, and a mask protective module disposed on the mask to transmit the light from the light source toward the mask. The mask protective module may include a frame, and a membrane supported by the frame. The membrane may include a penetration region for transmitting the light, and a peripheral region of which a light transmittance is lower than that of the penetration region.

In an embodiment, the light may include extreme ultraviolet light.

In an embodiment, the lithography apparatus may further include a penetration region replacing device. The penetration region replacing device may include a rod, and a penetration region mounting unit connected to an end of the rod, including a plurality of spaces where penetration region modules providing the penetration region of the membrane, and turning on the rod as an axis.

In an embodiment, the peripheral region may surround the penetration region, and mechanical strength or heat conductivity of the peripheral region may be higher than that of the penetration region.

In an embodiment, the penetration region may include a first penetration region and a second penetration region which are spaced apart from each other, and the peripheral region may surround the first and second penetration regions.

DETAILED DESCRIPTION OF THE EMBODIMENTS

Figure 1:
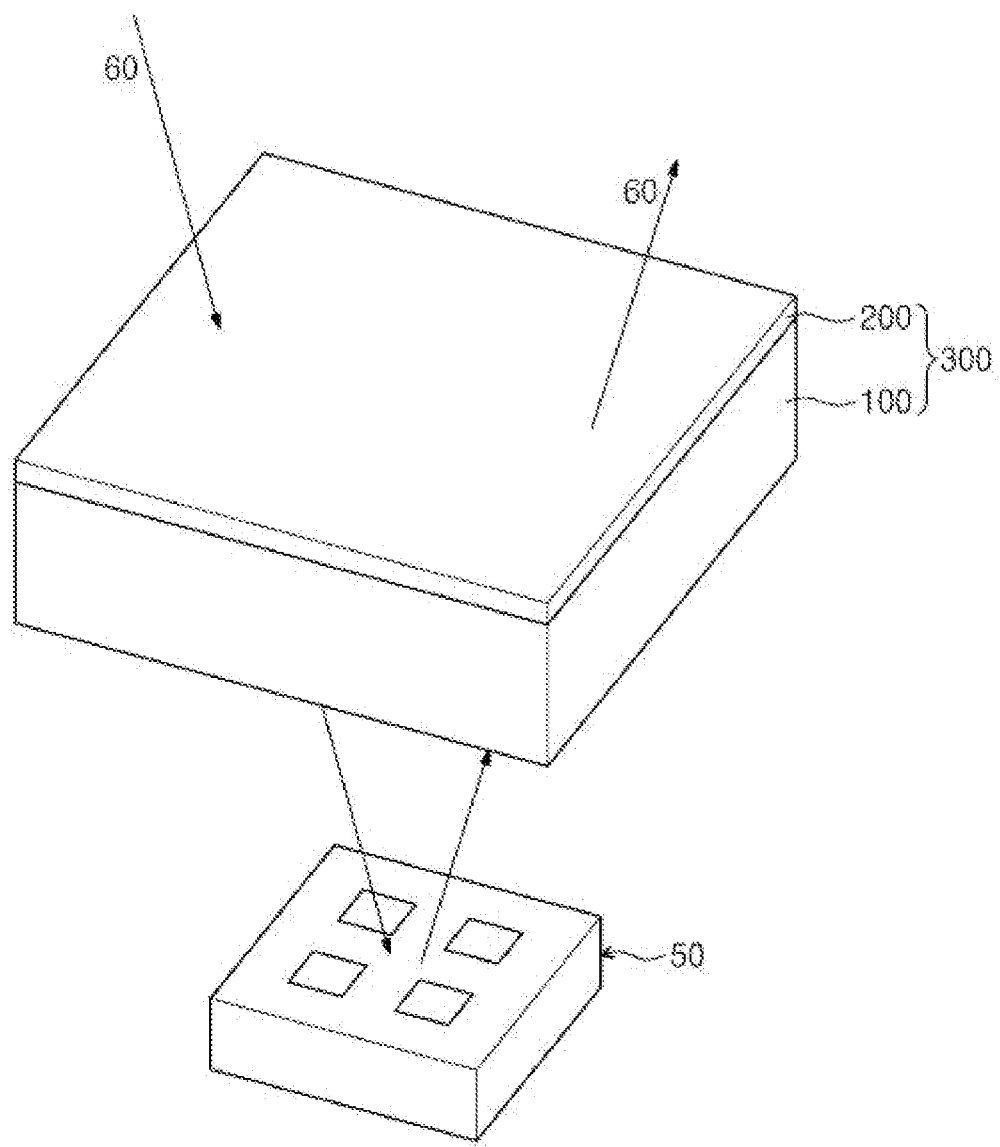
FIG. 1 is a schematic view illustrating a mask protective module according to an embodiment of the present disclosure.

The present disclosure will now be described more fully hereinafter with reference to the accompanying drawings, in which exemplary embodiments of the present disclosure are shown. It should be noted, however, that the present disclosure are not limited to the following exemplary embodiments, and may be implemented in various forms. Accordingly, the exemplary embodiments are provided only to disclose the inventive concepts and let those skilled in the art know the category of the inventive concepts.

It will be understood that when an element such as a layer, region or substrate is referred to as being "on" another element, it can be directly on the other element or intervening elements may be present. In addition, in the drawings, the thicknesses of layers and regions are exaggerated for clarity.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure. Exemplary embodiments of aspects of the present disclosure explained and illustrated herein include their complementary counterparts. As used herein, the term "and/or" includes any and all combinations of one or more of the associated listed items.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprises", "comprising", "includes", "including", "have", "has" and/or "having" when used herein, specify the presence of stated features, integers, steps, operations, elements, and/or components, but do not preclude the presence or addition of one or more other features, integers, steps, operations, elements, components, and/or groups thereof. Furthermore, it will be understood that when an element is referred to as being "connected" or "coupled" to another element, it may be directly connected or coupled to the other element or intervening elements may be present.

In addition, in explanation of the present disclosure, the descriptions to the elements and functions of related arts may be omitted if they obscure the subjects of the inventive concepts.

FIG. 1 is a schematic view illustrating a mask protective module according to an embodiment of the present disclosure. FIG. 1 illustrates a mask protective module and a mask, and the mask may be disposed in the interior space of the mask protective module.

Referring to FIG. 1, a mask protective module 300 may include a frame 100 and a membrane 200 supported by the frame 100. According to an embodiment, the mask protective module 300 may be a pellicle.

A mask 50 may be disposed under the mask protective module 300. In other words, the mask 50 may be disposed in an interior space which is surrounded by the frame 100 and the membrane 200.

Light 60 may enter the mask protective module 300. According to an embodiment, the light 60 may include extreme ultraviolet (EUV) light. The light 60 entering the membrane 200 of the mask protective module 300 may enter the mask 50 through the membrane 200.

According to an embodiment, the mask 50 may be a reflective mask. Thus, the light 60 entering the mask 50 may be reflected by the mask 50 and then may penetrate the membrane 200.

The membrane 200 may have regions of which transmittances of the light 60, heat conductivities and/or strengths are different from each other. Particularly, the membrane 200 may have a penetration region transmitting the light 60 and a peripheral region surrounding the penetration region.

Area of the penetration region may correspond to that of the light 60 entering the mask 50. For example, if the area of the light 60 is 110 mm×80 mm, the penetration region may have an area corresponding thereto.

According to an embodiment, a transmittance of the peripheral region with respect to the light 60 may be lower than that of the penetration region with respect to the light 60. According to an embodiment, a heat conductivity of the peripheral region may be higher than that of the penetration region. According to an embodiment, a strength of the peripheral region may be higher than that of the penetration region.

Mask protective modules according to various embodiments of the present disclosure will be described hereinafter with reference to FIGS. 2 to 10B.

Figure 2:
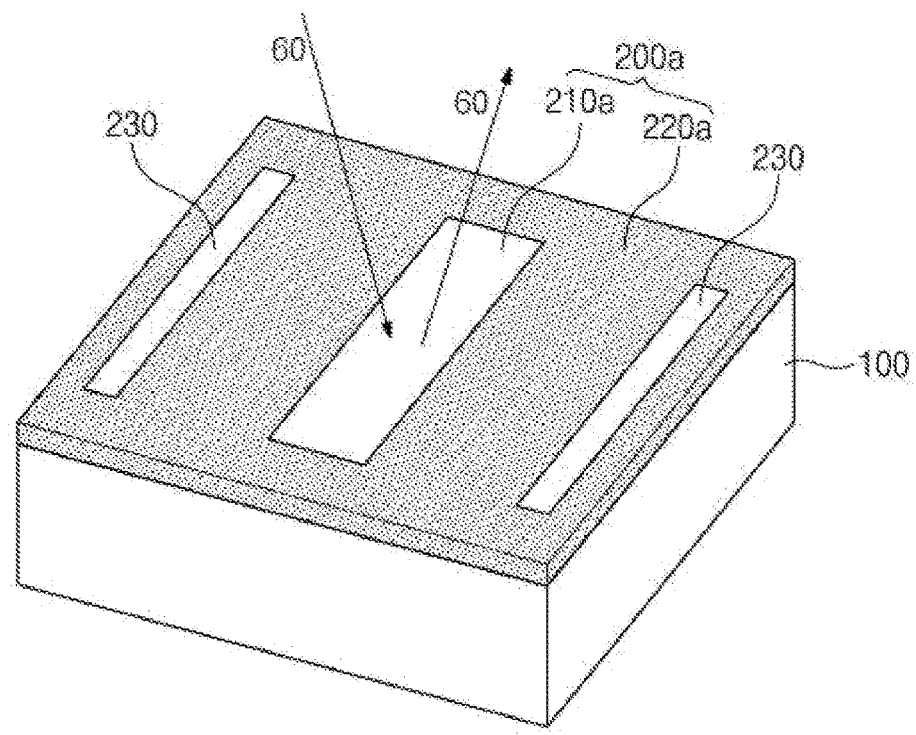
FIG. 2 is a schematic view illustrating a mask protective module according to a first embodiment of the present disclosure.

FIG. 2 is a schematic view illustrating a mask protective module according to a first embodiment of the present disclosure.

Referring to FIG. 2, a membrane 200a of a mask protective module according to a first embodiment of the present disclosure may include a penetration region 210a and a peripheral region 220a. The membrane 200a may have a plane shape and may be fixed on the frame 100.

According to an embodiment, a ratio of an area of the peripheral region 220a to an entire area of the membrane 200a may be greater than a ratio of an area of the penetration region 210a to the entire area of the membrane 200a. Alternatively, according to another embodiment, a ratio of an area of the penetration region 210a to the entire area of the membrane 200a may be greater than a ratio of an area of the peripheral region 220a to the entire area of the membrane 200a, unlike FIG. 2.

The penetration region 210a may be a region where the light 60 is transmitted. According to an embodiment, the penetration region 210a may have a polygonal shape as shown in FIG. 2. According to an embodiment, the penetration region 210a may be formed of a material of which a transmittance is 90% or more in 13.5 mm wavelength. For example, the penetration region 210a may include at least one of titanium, tantalum, tungsten, molybdenum, chromium, cobalt, boron, carbon, nickel, silver, platinum, zirconium, aluminum, beryllium, silicon, an oxide of at least one thereof, a nitride of at least one thereof, a carbide of at least one thereof, or a boride of at least one thereof. Alternatively, the penetration region 210a may include a carbon nanostructure such as graphene or carbon nanotube The peripheral region 220a may be surrounded by the penetration region 210a. Transmittances of the light 60, heat conductivities and/or strengths of the peripheral region 220a and the penetration region 210a may be different from each other.

According to an embodiment, the transmittance of the light 60 of the peripheral region 220a may be lower than that of the penetration region 210a. According to an embodiment, the heat conductivity of the peripheral region 220a may be higher than that of the penetration region 210a. According to an embodiment, the strength of the peripheral region 220a may be higher than that of the penetration region 210a.

The peripheral region 220a may be formed of a material different from that of the penetration region 210a. For example, the peripheral region 220a may include at least one of a metal, carbon, polymer, or ceramic.

According to an embodiment, the membrane 200a may further include an auxiliary penetration region 230 which transmits alignment light for aligning the mask protective module. For example, the alignment light may be deep ultraviolet (DUV) light. According to an embodiment, the auxiliary penetration region 230 and the penetration region 210a may be formed of the same material. According to another embodiment, the auxiliary penetration region 230 may be formed of a material (e.g., a material having a high transmittance with respect to the DUV light) different from that of the penetration region 210a.

The light 60 may enter the penetration region 210a of the mask protective module according to the first embodiment of the present disclosure. As described with reference to FIG. 1, the light 60 may penetrate the penetration region 210a to enter a mask which is disposed in an interior space of the mask protective module. As described with reference to FIG. 1, the mask may reflect the light 60, and the reflected light 60 may penetrate the penetration region 210a.

Unlike the above embodiments of the present disclosure, if the entire membrane 200a is formed of a material with a high transmittance for the light 60, it is difficult to manufacture a large-area mask protective module, and the membrane 200a is restricted to use materials because mechanical strength, thermal property and chemical resistance should be secured simultaneously with high transmittance for the light 60. Thus, it is difficult to manufacture a mask protective module having long life span and high reliability.

However, according to the embodiment of the present disclosure, the membrane 200a may include the penetration region 210a where the light 60 is transmitted, and the peripheral region 220a which surrounds the penetration region 210a, as described above. The light 60 may enter and penetrate the penetration region 210a, and the light 60 reflected by the mask may enter and penetrate the penetration region 210a. Thus, the peripheral region 220a may be formed of a material which has a relatively low transmittance for the light but has relatively high heat conductivity, strength and/or chemical resistance as compared with the penetration region 210a. Accordingly, materials for the membrane 200a may be various, and mechanical strength, thermal endurance and/or chemical resistance of the membrane 200a may be improved. Further, it is possible to manufacture the mask protective module of a large area. Therefore, the embodiment of the present disclosure may provide mask protective modules with long life span and low manufacturing cost.

Figure 3:
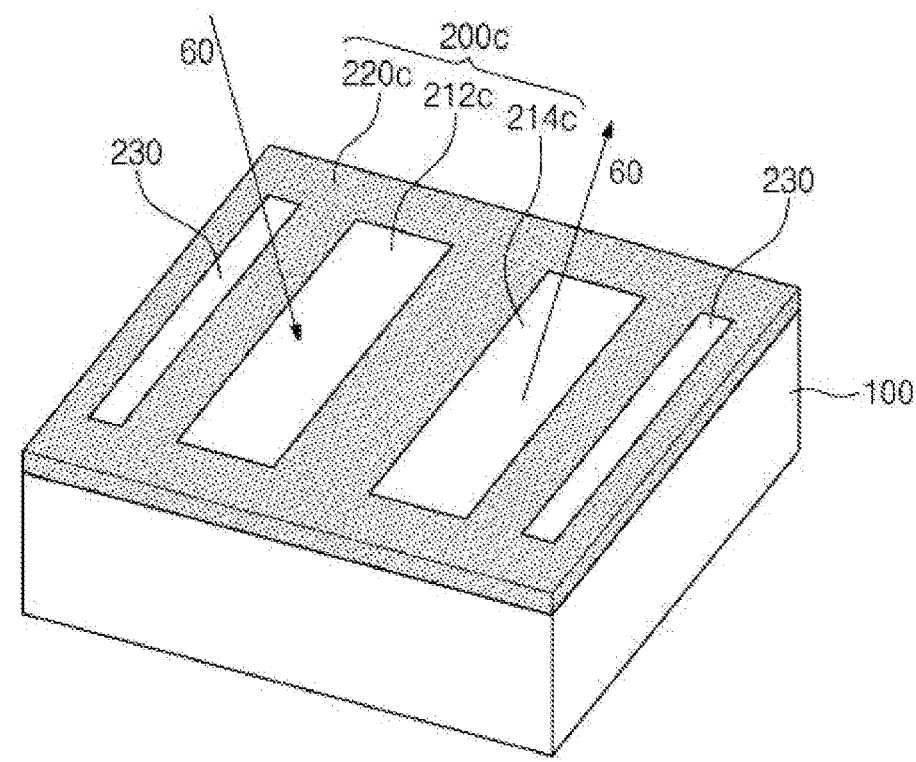
FIG. 3 is a schematic view illustrating a mask protective module according to a second embodiment of the present disclosure.

FIG. 3 is a schematic view illustrating a mask protective module according to a second embodiment of the present disclosure.

Referring to FIG. 3, a membrane 200c of a mask protective module according to a second embodiment of the present disclosure may include a plurality of penetration regions 212c and 214c and a peripheral region 220c, in contrast to the mask protective module according to the first embodiment of the present disclosure which was described with reference to FIG. 2. As described with reference to FIG. 2, transmittances, heat conductivities and/or strengths of the plurality of the penetration regions 212c and 214c and the peripheral region 220c may be different from each other.

The plurality of penetration regions 212c and 214c may include a first penetration region 212c and a second penetration region 214c. The first penetration region 212c and the second penetration region 214c may be spaced apart from each other. In other words, the peripheral region 220c may be interposed between the first penetration region 212c and the second penetration region 214c.

The light 60 may enter the first penetration region 212c. The light 60 may penetrate the first penetration region 212c to enter the mask which is disposed in an interior space of the mask protective module. The mask may reflect the light 60. The reflected light 60 may penetrate the second penetration region 214c.

In an embodiment, the first penetration region 212c and the second penetration region 214c may be formed of the same material. In another embodiment, the first penetration region 212c and the second penetration region 214c may formed of different materials from each other. For example, the first penetration region 212c may be formed of a material which is proper to transmit the light 60 incident from a light source, and the second penetration region 214c may be formed of a material which is proper to transmit the light 60 reflected by the mask.

Figure 4:
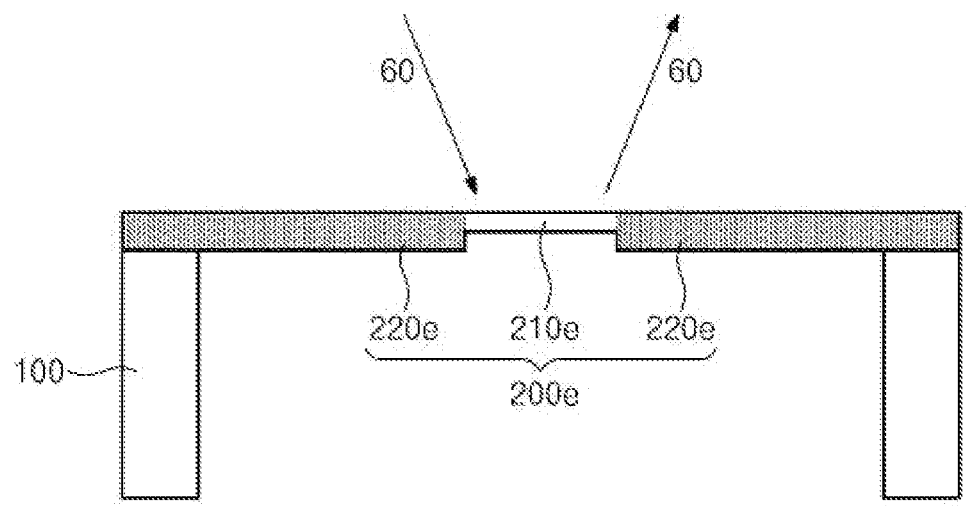
FIG. 4 is a schematic view illustrating a mask protective module according to a third embodiment of the present disclosure.

FIG. 4 is a schematic view illustrating a mask protective module according to a third embodiment of the present disclosure.

Referring to FIG. 4, a membrane 200e of a mask protective module according to a third embodiment may include a penetration region 210e and a peripheral region 220e, and a thickness of the penetration region 210e may be thinner than that of the peripheral region 220e.

According to an embodiment, the penetration region 210e and the peripheral region 220e may be formed of the same material, and the thickness of the penetration region 210e may be thinner than that of the peripheral region 220e. According to another embodiment, the penetration region 210e and the peripheral region 220e may be formed of different materials from each other, and the thickness of the penetration region 210e may be thinner than that of the peripheral region 220e.

Because of the difference in thickness between the penetration region 210e and the peripheral region 220e, a transmittance of the penetration region 210e for the light 60 may be higher than that of the peripheral region 220e, and heat conductivity and strength of the penetration region 210e may be lower than those of the peripheral region 220e.

The light 60 may enter and penetrate the penetration region 210e, and the light 60 may be reflected by a mask disposed under the mask protective module and then may penetrate the penetration region 210e.

Further, even though not shown in FIG. 4, as described with reference to FIG. 2, the membrane 200e may further include an auxiliary penetration region where alignment light is transmitted.

Figure 5:
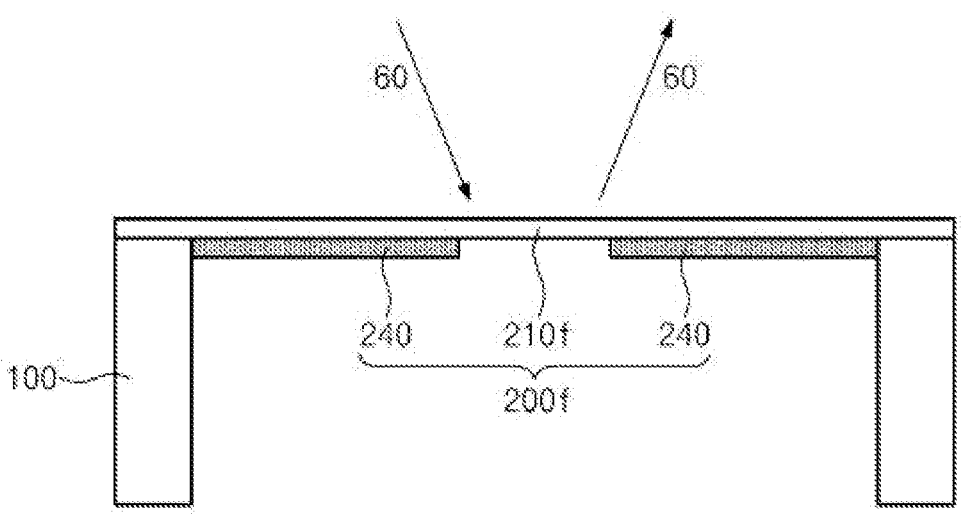
FIG. 5 is a schematic view illustrating a mask protective module according to a fourth embodiment of the present disclosure.

FIG. 5 is a schematic view illustrating a mask protective module according to a fourth embodiment of the present disclosure.

Referring to FIG. 5, a membrane 200f of a mask protective module according to a fourth embodiment of the present disclosure may include a base membrane 210f and a support membrane 240.

The base membrane 210f may be formed of a material which has a high transmittance for the light 60. For example, the base membrane 210f may be formed of the same material as the penetration region described with reference to the FIG. 2.

The support membrane 240 may be formed of a material with higher heat conductivity and/or strength than that (those) of the base membrane 210f. For example, the support membrane 240 may be formed of the same material as the peripheral region described with reference to the FIG. 2.

The support membrane 240 may be disposed on the base membrane 210f and may cover a portion of the base membrane 210f. In other words, the membrane 200f may include a peripheral region where the base membrane 210f and the support membrane 230 overlap with each other, and a penetration region where the base membrane 210f and the support membrane 230 do not overlap with each other.

According to whether the support membrane 240 and the base membrane 210f overlap with each other, a transmittance of the penetration region for the light 60 may be higher than that of the peripheral region, and a heat conductivity and a strength of the penetration region may be lower than those of the peripheral region.

The light 60 may enter and penetrate the penetration region, and the light 60 may be reflected by a mask disposed under the mask protective module and then may penetrate the penetration region.

Figure 6:
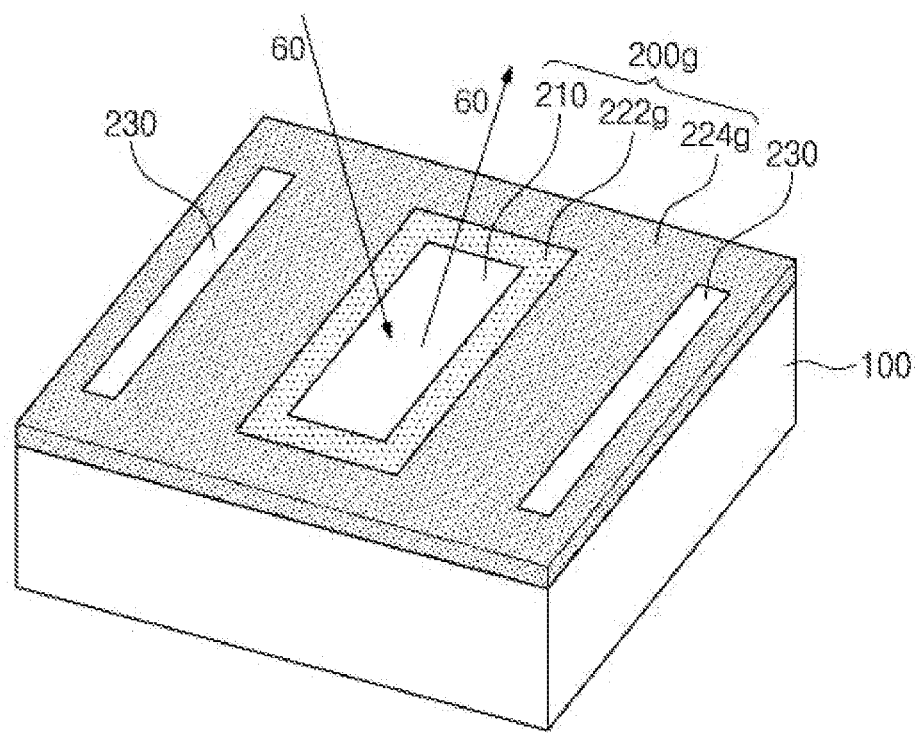
FIG. 6 is a schematic view illustrating a mask protective module according to a fifth embodiment of the present disclosure.

FIG. 6 is a schematic view illustrating a mask protective module according to a fifth embodiment of the present disclosure.

Referring to FIG. 6, a membrane 200g of a mask protective module according to a fifth embodiment of the present disclosure may include a penetration region 210 and a plurality of peripheral regions 222g and 224g which surround the penetration region 210.

The light 60 may enter and penetrate the penetration region 210, and the light 60 may be reflected by a mask disposed under the mask protective module and then may penetrate the penetration region 210.

The plurality of peripheral regions 222g and 224g may include a first peripheral region 222g and a second peripheral region 224g. The first peripheral regions 222g may surround the penetration region 210, and the second peripheral region 224g may surround the first peripheral region 224g.

According to an embodiment, the first peripheral region 222g and the second peripheral region 222g may be formed of different materials from each other. Thus, a heat conductivity of the first peripheral region 222g may be higher than that of the second peripheral region 224g. Therefore, in a lithography process using the mask protective module, heat generated from the penetration region 210 may be easily transmitted to the peripheral regions 222g and 224g such that thermal endurance of the mask protective module may be improved. A strength of the second peripheral region 224g which is supported by the frame 100 may be higher than that of the first peripheral region 222g. Thus, mechanical strength of the membrane 200g may be enhanced such that the strength of the mask protective module may be enhanced.

Figure 7A:
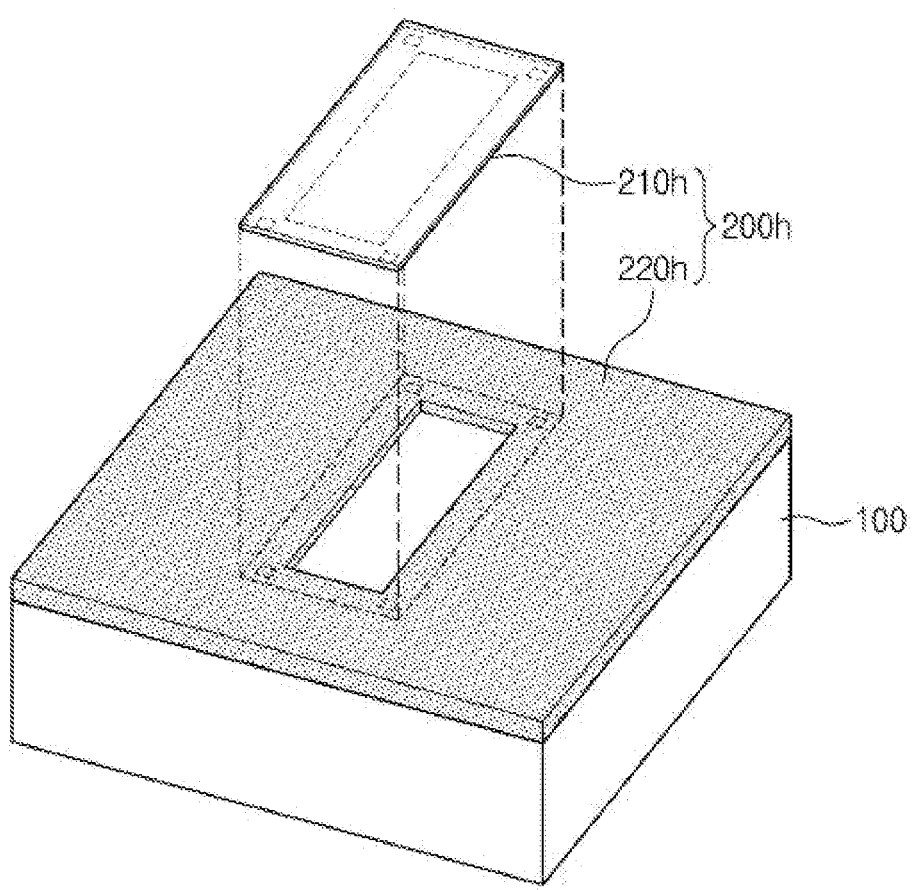
FIGS. 7A and 7B are schematic views illustrating a mask protective module according to a sixth embodiment of the present disclosure.
Figure 7B:
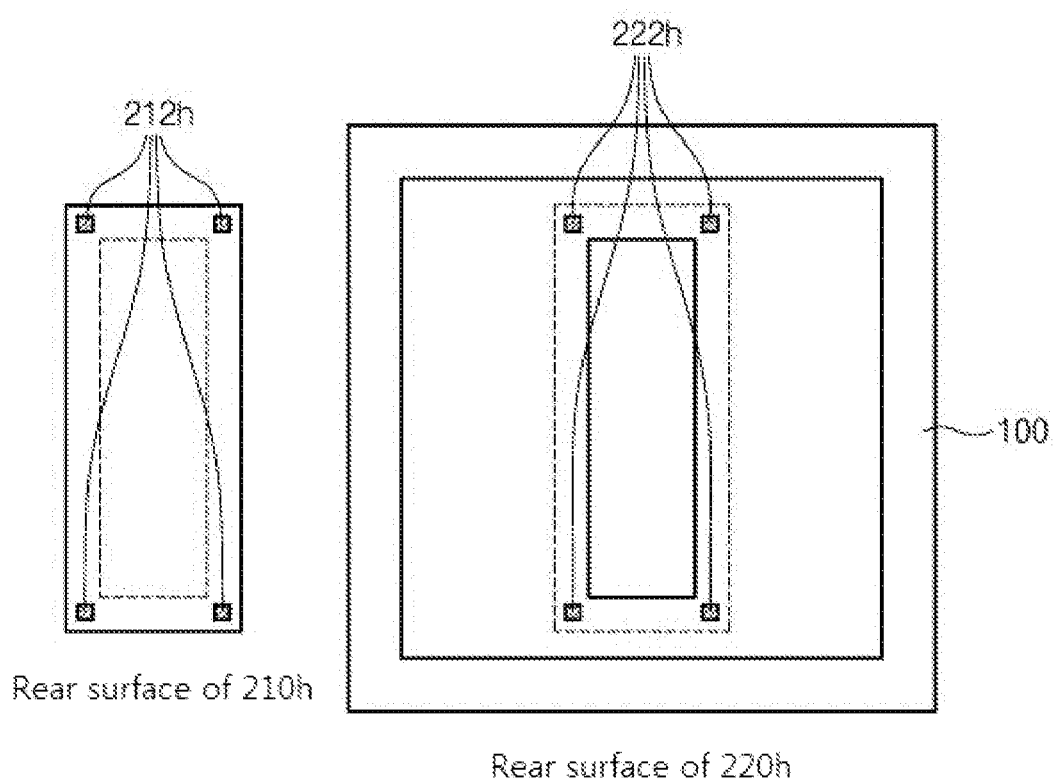

FIGS. 7A and 7B are schematic views illustrating a mask protective module according to a sixth embodiment of the present disclosure.

Referring to FIGS. 7A and 7B, a membrane 200h of a mask protective module according to a sixth embodiment of the present disclosure may include a penetration region 210h and a peripheral region 220h surrounding the penetration region 210h.

The penetration region 210h may be detachable from the peripheral region 220h. For example, a first adhesive element 212h may be provided on a surface of the penetration region 210h. The surface of the penetration region 210h may be a surface which is in contact with the peripheral region 220h. Further, the peripheral region 220h may have an opening which is covered by the penetration region 210h, and a second adhesive element 222h may be provided on a surface of the peripheral region 220h around the opening. The surface of the peripheral region 220h may be a surface which is exposed to an interior space of the mask protective module. The first adhesive element 212h and the second adhesive element 222h may be magnets of different polarities from each other. Thus, the penetration region 210h may be easily attached/detached to/from the peripheral region 220h.

As described above, the penetration region 210h may be easily detachable from the peripheral region 220h. Thus, in a lithography process using the mask protective module, the penetration region 210h may be selectively replaced without replacing the entire mask protective module when the penetration region 210h transmitting the light is necessary to be replaced. Therefore, it is accomplished to provide the mask protective module with low replacing cost and simple replacing process According to a modified embodiment of the sixth embodiment in contrast to the above sixth embodiment of the present disclosure, the penetration region 210h may be attached on the peripheral region 220h using an adhesive without the first and second adhesive elements 212h and 222h of the penetration region 210h and the peripheral region 220h.

Figure 8A:
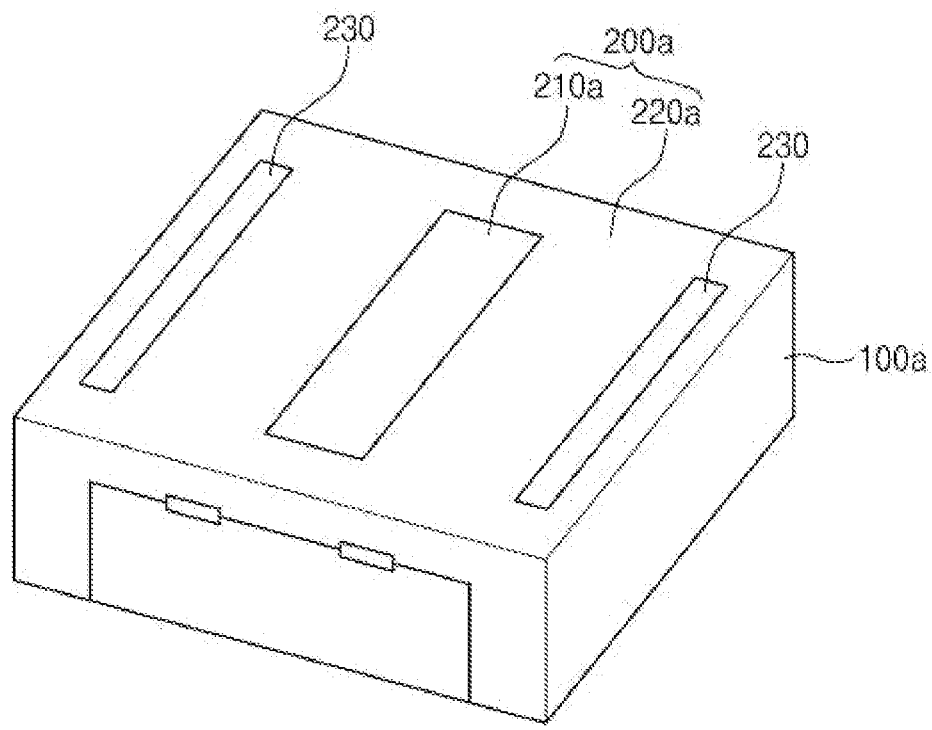
FIGS. 8A and 8B are schematic views illustrating a mask protective module according to a seventh embodiment of the present disclosure.
Figure 8B:
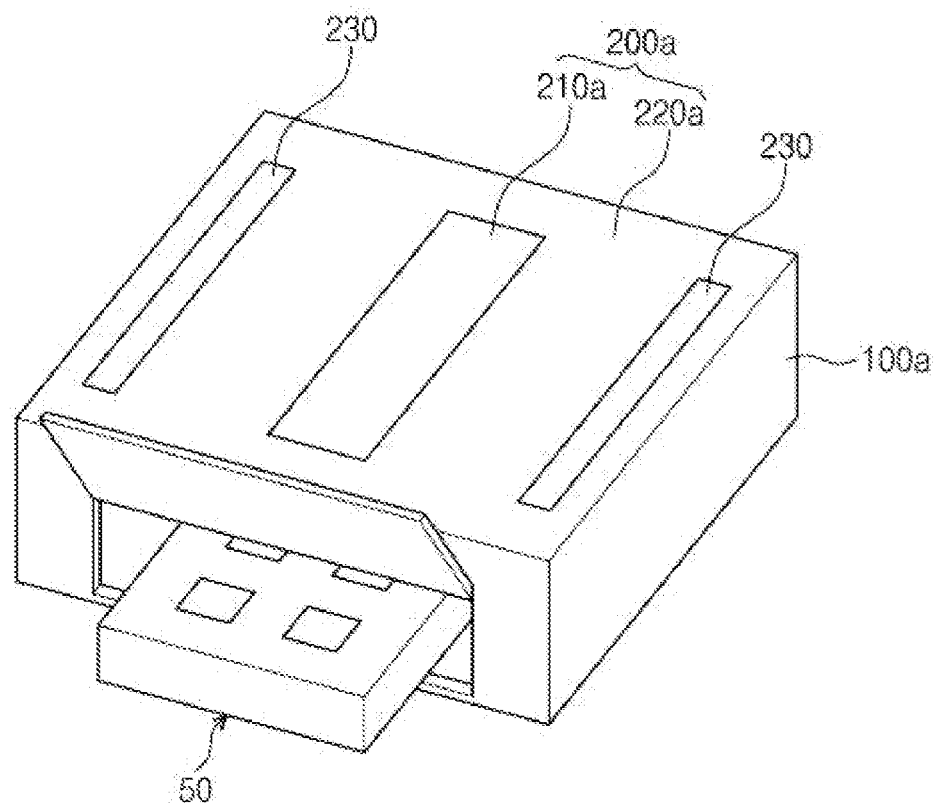

FIGS. 8A and 8B are schematic views illustrating a mask protective module according to a seventh embodiment of the present disclosure.

Referring to FIGS. 8A and 8B, a membrane 200a of a mask protective module according to a seventh embodiment of the present disclosure may include, as described with reference to FIG. 2, a penetration region 210a and a peripheral region 220a, and a frame 100a may provide a path through which a mask 50 may be inserted or withdrawn.

The frame 100a and the membrane 200a may define an interior space, and the mask 50 may be disposed in the interior space. A portion of the frame 100a may be configured to open the interior space. In other words, if the frame 100a has four sidewall portions which are connected to each other, one of the sidewall portions may open to provide the path through which the mask 50 is inserted into the interior space. Thus, the mask 50 may be inserted into or withdrawn from the interior space.

Figure 9A:
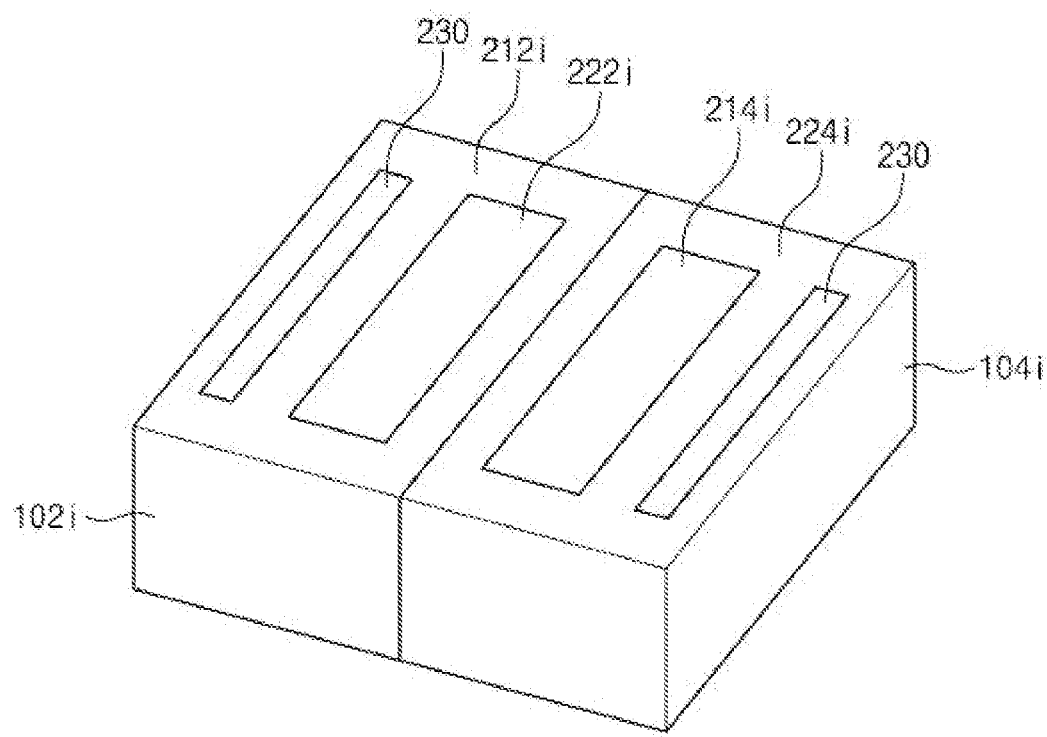
FIGS. 9A and 9B are schematic views illustrating a mask protective module according to an eighth embodiment of the present disclosure.
Figure 9B:
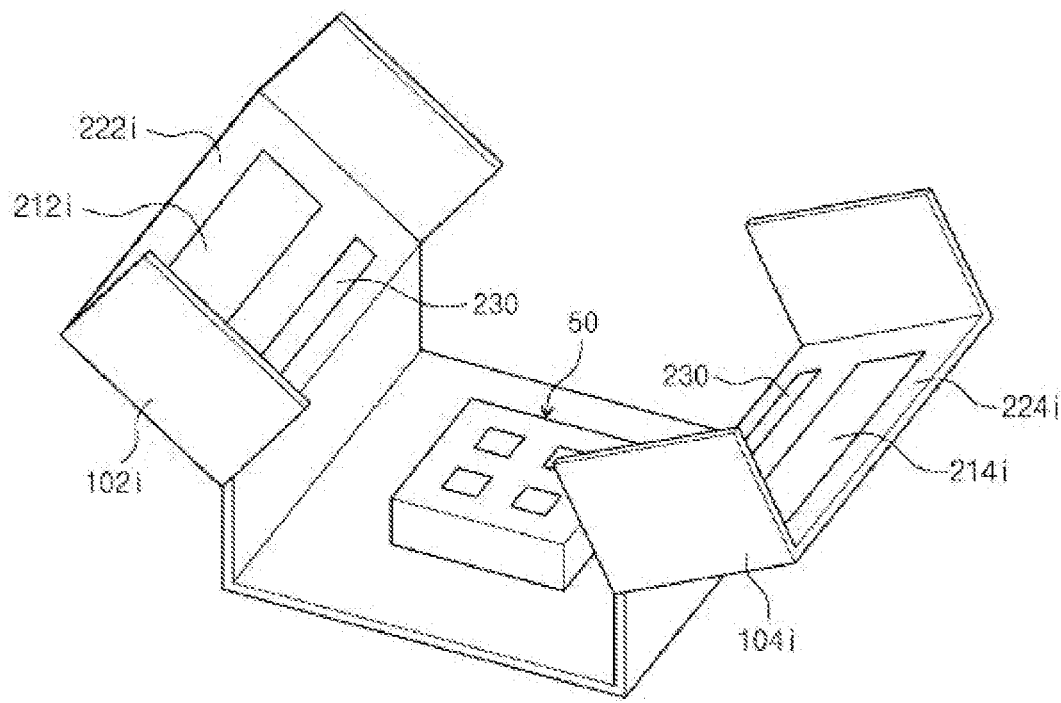

FIGS. 9A and 9B are schematic views illustrating a mask protective module according to an eighth embodiment of the present disclosure.

Referring to FIGS. 9A and 9B, a membrane of a mask protective module according to an eighth embodiment of the present disclosure may include a first membrane 212i and 222i and a second membrane 214i and 224i, and a frame may include a first frame 102i and a second frame 104i.

The first membrane 212i and 222i and the second membrane 214i and 224i may be configured to be separated from each other, and the first frame 102i and a second frame 104i may be configured to be separated from each other.

The first membrane 212i and 222i may be supported and fixed by the first frame 102i, and the second membrane 214i and 224i may be supported and fixed by the second frame 104i.

The mask protective module according to the eighth embodiment of the present disclosure may include a first segment which includes the first membrane 212i and 222i and the first frame 102i, and a second segment which includes the second membrane 214i and 224i and the second frame 104i. The first segment and the second segment may be configured to be separated and divided from each other. In other words, the first segment and the second segment may be separated from each other to provide a path through which the mask 50 is inserted or withdrawn into or from an interior space surrounded by the membrane and the frame, as shown in FIG. 11B.

Specifically, the first frame 102i may include first to third sidewall portions. The first sidewall portion and the third sidewall portion may face each other, and the second sidewall portion may connect the first and second sidewall portions. In this case, the second sidewall portion may be fixed, and the first sidewall portion, the third sidewall portion and the first membrane 212i and 222i may be opened. The second segment may be opened by the same method as the first segment. Thus, the mask 50 may be easily inserted into or withdrawn from the interior space.

Figure 10A:
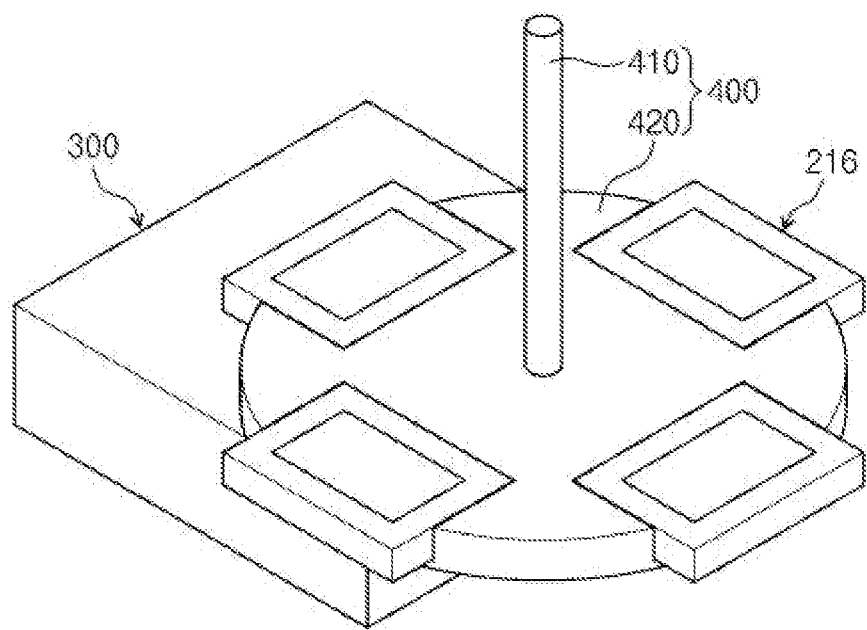
FIGS. 10A and 10B are schematic views illustrating a mask protective module and a penetration region replacing device according to an embodiment of the present disclosure.
Figure 10B:
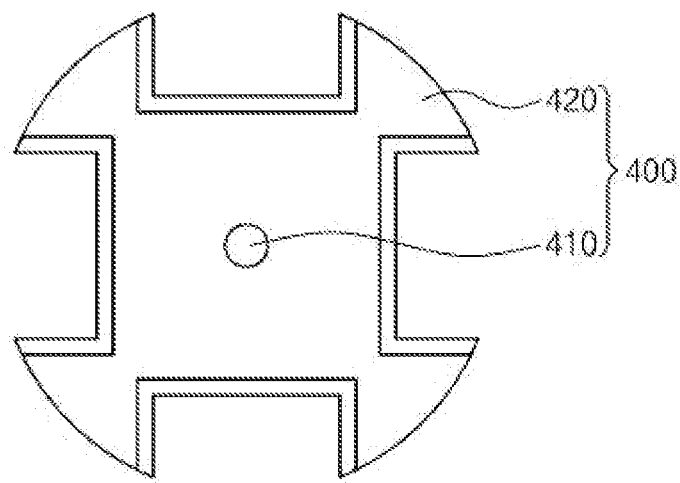

FIGS. 10A and 10B are schematic views illustrating a mask protective module and a penetration region replacing device according to an embodiment of the present disclosure.

Referring to FIGS. 10A and 10B, the mask protective module 300 according to one of the above embodiments and a penetration region replacing device 400 on the mask protective module 300 may be provided. According to an embodiment, a lithography apparatus may include the penetration region replacing device 400.

The penetration region replacing device 400 may include a rod 410 and a penetration region mounting unit 420 connected to an end of the rod 410. The penetration region mounting unit 420 may turn on the rod 410 as an axis.

The penetration region mounting unit 420 may provide spaces for mounting a plurality of penetration region modules 216 which provide penetration regions of the mask protective module. In other words, a region of the membrane of the mask protective module, in which the penetration region is provided, may be an opening, and the penetration region module 216 may be disposed in the opening of the membrane to provide the penetration region of the mask protective module.

As described with reference to FIGS. 1 and 2, light may enter the penetration region and a lithography process may be performed several times, and the penetration region mounting unit 420 may turn to provide a new penetration region module 216 not used on the mask protective module 300 if it is necessary to replace the penetration region. In other words, the new penetration region module 216 not used may provide the penetration region of the mask protective module 300. Thus, in-situ replacement of the penetration region is accomplished to provide a lithography process and a lithography apparatus capable of reducing process time and enhancing process efficiency.

Figure 11:
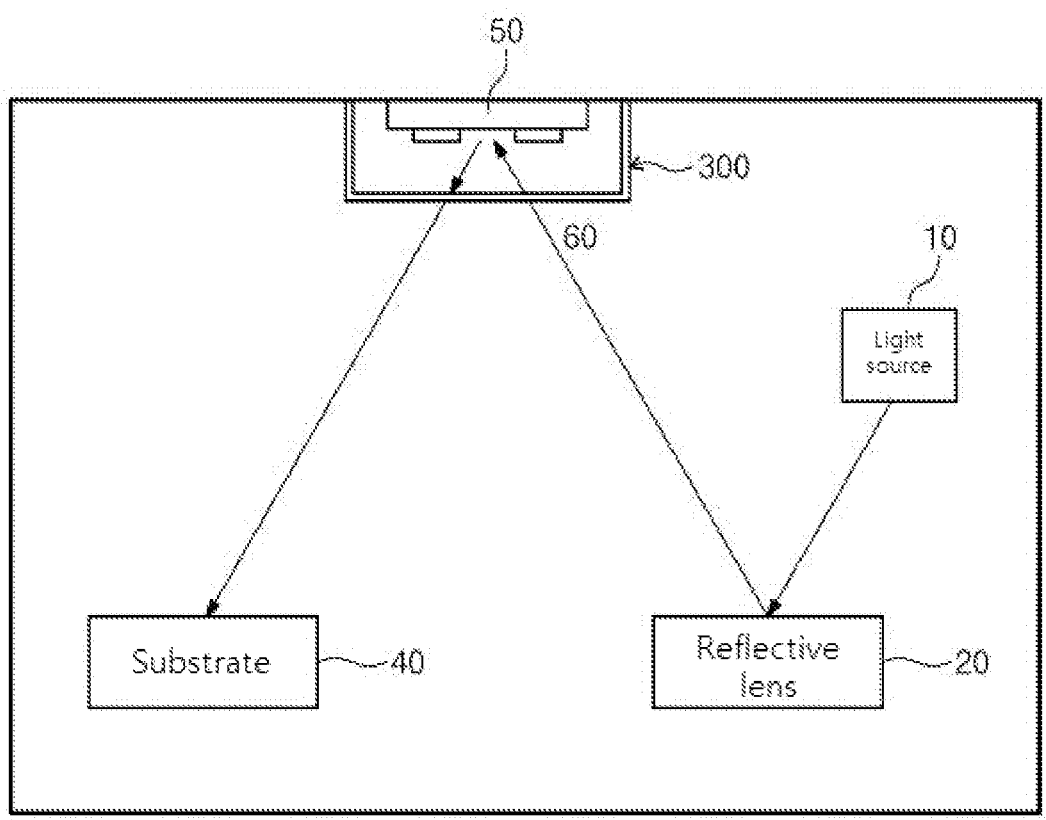
FIG. 11 is schematic view illustrating a lithography apparatus according to an embodiment of the present disclosure.

FIG. 11 is schematic view illustrating a lithography apparatus according to an embodiment of the present disclosure.

Referring to FIG. 11, a lithography apparatus according to embodiments of the present disclosure may include a light source 10, a reflective lens 20, a mask mounting zone, and a mask protective module 300.

The light source 10 may emit light 60. According to an embodiment, the light 60 may be EUV light.

The light emitted from the light source 10 may enter the reflective lens 20, and the reflective lens 20 may reflect the light 60 toward the mask protective module 300. The reflective lens 20 may include a plurality of lenses.

A mask 50 may be disposed on the mask mounting zone. According to an embodiment, the mask 50 may be a reflective mask. Thus, the mask 50 may reflect the light 60 if the light 60 enters the mask 50.

The mask protective module 300 may be one of the mask protective modules according to the first to eighth embodiments of the present disclosure. The mask protective module 300 may be disposed on the mask 50 to transmit the light 60 emitted from the light source 10 toward the mask 50. More specifically, the light 60 may penetrate the penetration region of the membrane to enter the mask 50, as described in the above embodiments. The mask 50 may reflect the light 60 as described above, and the reflected light 60 may penetrate the penetration region of the membrane to enter a substrate 40, as described in embodiments of the present disclosure.

The light 60 reflected from the mask 50 may enter a substrate 40 after passing through a plurality of lenses (not shown).

Figure 12:
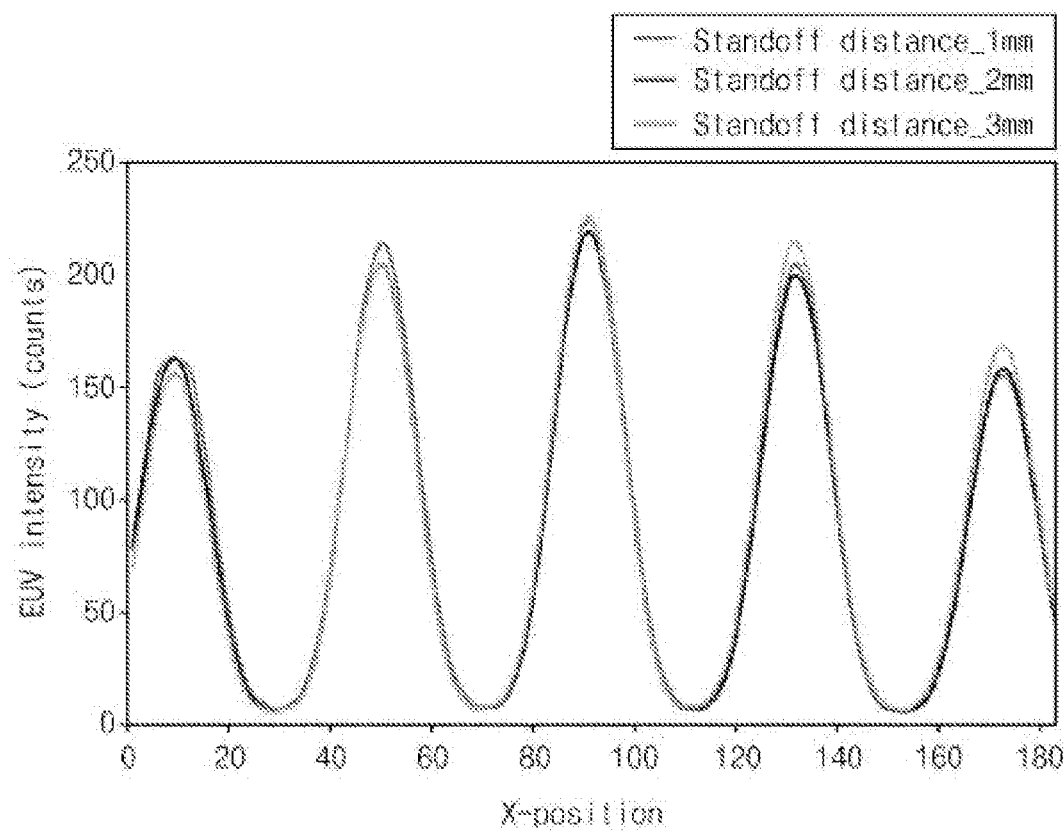
FIG. 12 is a graph showing EUV intensity as distance between a mask and a membrane of the mask protective module according to an embodiment of the present disclosure.
Figure 13:
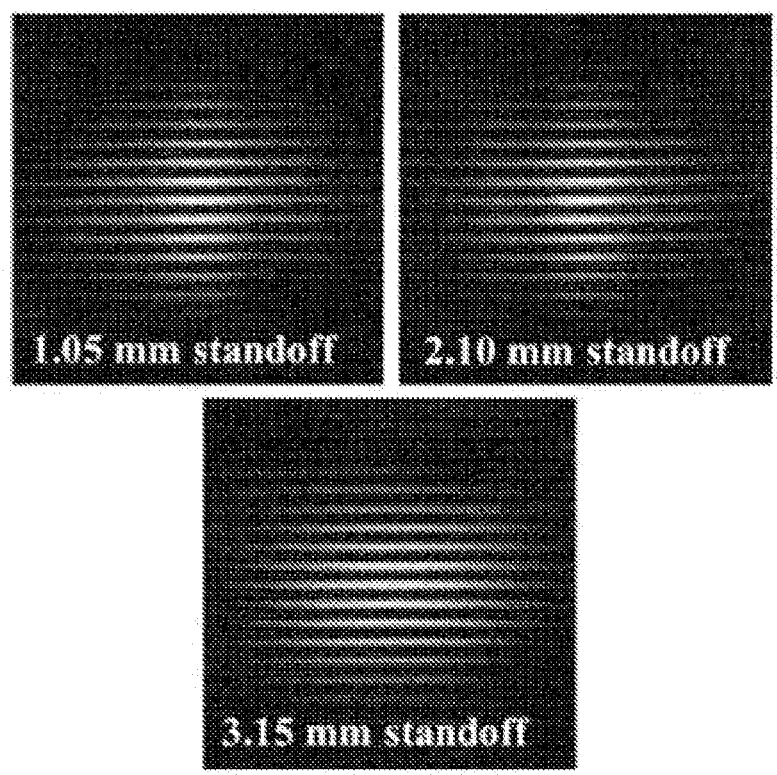
FIG. 13 shows images showing image property as distance between a mask and a membrane of the mask protective module according to an embodiment of the present disclosure.
Figure 14:
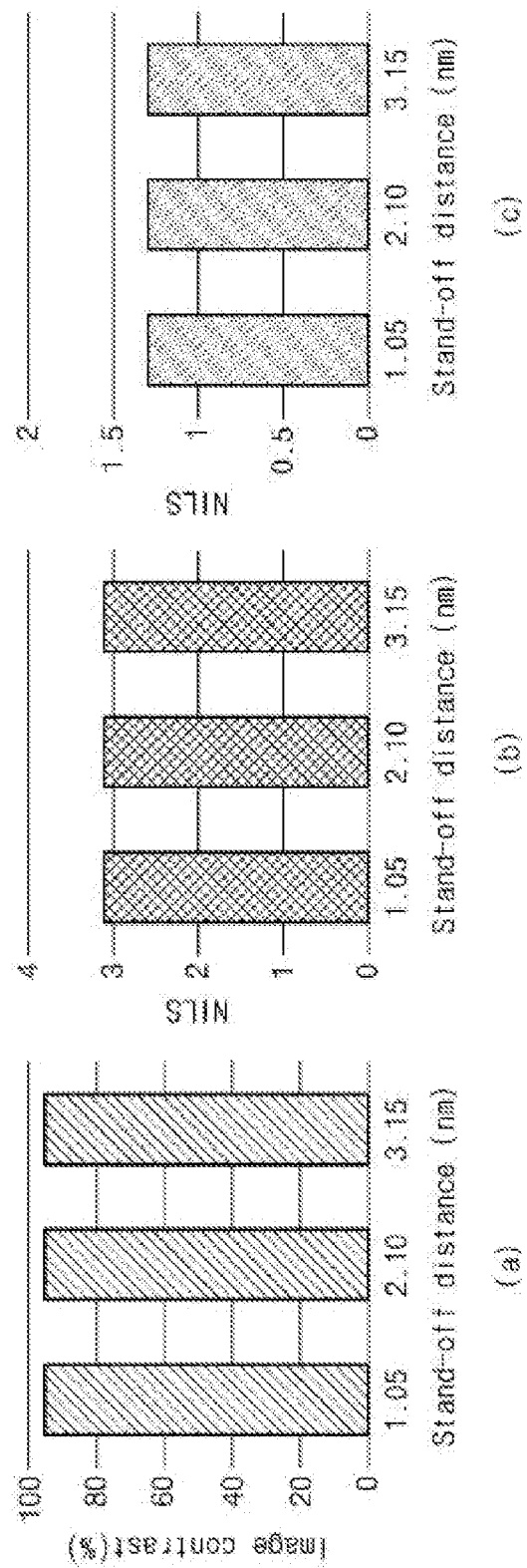
FIG. 14 shows graphs showing image contrast, NILS and H-V CD bias EUV intensity as distance between a mask and a membrane of the mask protective module according to an embodiment of the present disclosure.

FIG. 12 is a graph showing EUV intensity as distance between a mask and a membrane of the mask protective module according to an embodiment of the present disclosure, FIG. 13 shows images showing image properties as distance between a mask and a membrane of the mask protective module according to an embodiment of the present disclosure, and FIG. 14 shows graphs showing image contrast, NILS and H-V CD bias EUV intensity as distance between a mask and a membrane of the mask protective module according to an embodiment of the present disclosure.

Referring to FIGS. 12 to 14, a mask protective module having a membrane formed of silicon nitride was manufactured, and EUV intensity according to a distance between the silicon nitride membrane and the mask, image property, image contrast, NILS and H-V CD bias were measured while irradiating EUV light.

As shown in FIGS. 12 to 14, the EUV intensity, the image property, and the image contrast, NILS and H-V CD bias characteristics were substantially constant even though the distance between the silicon nitride membrane and the mask was changed. In other words, as described with reference to FIGS. 1 to 10B, the lithography properties are not affected even if the mask protective modules including the penetration regions of various shapes are used to change the distance between the membrane and the mask.

The mask protective module according to embodiments of the present disclosure may include the frame and the membrane supported by the frame, and the membrane may have the regions of which the light transmittances, the heat conductivities and/or strengths are different from each other.

In other words, for example, the membrane may have the peripheral region and the penetration region, and the peripheral region may have heat conductivity, strength and/or chemical resistance higher than that(those) of the penetration region even though the transmittance of the peripheral region is lower than that of the penetration region. Accordingly, materials for the membrane may be various, and the mechanical strength, thermal endurance and/or chemical resistance of the membrane may be improved. Further, it is possible to easily manufacture the mask protective module of a large area. Therefore, the present disclosure may provide mask protective modules with long life span and low manufacturing cost.

The mask protective module, the pellicle having the same, and the lithography apparatus having the same may be used in processes of manufacturing various electronic devices, such as a semiconductor manufacturing process and a display manufacturing process.

While the present disclosure has been described with reference to exemplary embodiments, it will be apparent to those skilled in the art that various changes and modifications may be made without departing from the spirits and scopes of the present disclosure. Therefore, it should be understood that the above embodiments are not limiting, but illustrative. Thus, the scopes of the present disclosure are to be determined by the broadest permissible interpretation of the following claims and their equivalents, and shall not be restricted or limited by the foregoing description.

What is claimed is:

1. A lithography apparatus comprising:
a light source for emitting light;
a mask mounting zone where a mask for reflecting the light is disposed; and
a mask protective module disposed on the mask to transmit the light from the light source toward the mask, and
a penetration region replacing device,
wherein the penetration region replacing device comprises:
a rod; and
a penetration region mounting unit connected to an end of the rod and configured to turn on the rod as an axis, wherein the penetration region mounting unit comprises a plurality of penetration region modules providing a penetration region of a membrane and turns to provide a new penetration region module not used on the mask protective module,
wherein the mask protective module comprises,
a frame; and
the membrane supported by the frame,
wherein the membrane includes the penetration region for transmitting the light and a peripheral region of which a light transmittance is lower than that of the penetration region.

2. The lithography apparatus of claim 1, wherein the light comprises extreme ultraviolet light.

3. The lithography apparatus of claim 1, wherein the peripheral region surrounds the penetration region, and
wherein mechanical strength or heat conductivity of the peripheral region is higher than that of the penetration region.

4. The lithography apparatus of claim 1, wherein the penetration region comprises a first penetration region and a second penetration region which are spaced apart from each other, and the peripheral region surrounds the first and second penetration regions.

* * * * *